US009023225B2

(12) United States Patent
Oyama et al.

(10) Patent No.: US 9,023,225 B2
(45) Date of Patent: May 5, 2015

(54) PATTERN FORMING METHOD

(71) Applicant: Tokyo Electron Limited, Tokyo (JP)

(72) Inventors: Kenichi Oyama, Nirasaki (JP); Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/038,345

(22) Filed: Sep. 26, 2013

(65) Prior Publication Data

US 2014/0094034 A1 Apr. 3, 2014

(30) Foreign Application Priority Data

Sep. 28, 2012 (JP) ................................ 2012-216388

(51) Int. Cl.

*H01L 21/306* (2006.01)
*H01L 21/308* (2006.01)
*B81C 1/00* (2006.01)

(52) U.S. Cl.

CPC .......... *H01L 21/306* (2013.01); *H01L 21/3086* (2013.01); *B81C 1/00031* (2013.01); *B81C 2201/0149* (2013.01)

(58) Field of Classification Search

None
See application file for complete search history.

(56) References Cited

U.S. PATENT DOCUMENTS

| | | | | |
|---|---|---|---|---|
| 2008/0073743 | A1* | 3/2008 | Alizadeh et al. | 257/461 |
| 2009/0130380 | A1* | 5/2009 | Asakawa et al. | 428/116 |
| 2011/0003069 | A1* | 1/2011 | Ho et al. | 427/58 |

FOREIGN PATENT DOCUMENTS

| | | | |
|---|---|---|---|
| JP | 2005-29779 | A | 2/2005 |
| JP | 2008-149447 | A | 7/2008 |
| JP | 2009-88085 | A | 4/2009 |

* cited by examiner

*Primary Examiner* — Allan Olsen

(74) *Attorney, Agent, or Firm* — Nath, Goldberg & Meyer; Jerald L. Meyer; Tiffany A. Johnson

(57) ABSTRACT

A pattern forming method includes forming a pattern forming material film on a substrate as an etching target film, the pattern forming material film having an exposing section that has porosity upon exposure and a non-exposing section, patterning and exposing the pattern forming material film for the exposing section to have the porosity, selectively infiltrating a filling material into voids of the exposing section to reinforce the exposing section, and removing the non-exposing section of the pattern forming material film by dry etching to form a predetermined pattern.

11 Claims, 3 Drawing Sheets

Forming DSA material film on semiconductor wafer — Process 1

Patterning and exposing DSA material film — Process 2

Selectively infiltrating filling material into voids of at least a surface of exposing section — Process 3

Removing non-exposing section through dry etching to form predetermined pattern — Process 4

PATTERN FORMING METHOD

CROSS-REFERENCE TO RELATED APPLICATION

This application claims the benefit of Japanese Patent Application No. 2012-216388, filed on Sep. 28, 2012 in the Japan Patent Office, the disclosure of which is incorporated herein in its entirety by reference.

TECHNICAL FIELD

The present disclosure relates to a pattern forming method of forming a pattern in a semiconductor fabricating process.

BACKGROUND

In fabricating a semiconductor device, a lithography technology using deep ultraviolet (DUV) light with a wavelength of 193 nm and ArF gas as a light source has been predominantly used pursuant to the demand for miniaturization, thereby obtaining a fine pattern of about 40 nm.

Further, combining the above-described photolithography technology using the light with the wavelength of 193 nm (ArF), as a basic technology, with a self-aligned double patterning (SADP) technology enables achievement of a miniaturization down to about 20 nm.

Meanwhile, a directed self-assembly (DSA) technology using a block copolymer has been proposed as a fine pattern forming technology which does not require an exposure apparatus.

In the DSA technology, for example, a block copolymer in which chains of A polymer and B polymer are bonded to each other at their ends is initially applied onto a substrate. Next, if the substrate is heated, the chains of the A polymer and B polymer randomly dissolved in a solid are subjected to phase separation, so that the regions of the A polymer and B polymer are regularly arranged. Then, the block copolymer is patterned by removing any one of the regions of the A polymer and B polymer to form a mask with a predetermined pattern. An example of the block copolymer includes a copolymer in which polystyrene (PS) and polymethyl methacrylate (PMMA) are bonded. In such block copolymer, a fine pattern up to 10 nm may be formed.

However, a photoresist for 193 nm exposure has a structurally insufficient strength. In this case, if the photoresist is formed in a fine pattern, there is a risk that the pattern may collapse due to wet development. Further, the roughness (e.g., line edge roughness (LER) or the like) of the pattern increases due to image blur caused by the wet development. Furthermore, the photoresist film may have a roughened surface due to low resistance to dry etching (i.e., plasma etching) conducted after the formation of the pattern, or disappearance of the film may occur due to low mask selectivity. This may cause various problems, e.g., deterioration in shape of an etched pattern.

Additionally, even in the DSA technology, the pattern may collapse in the wet development. Further, the mask selectivity being low in an etching process may cause problems to obtain a desired pattern. Furthermore, it is required to form a guide pattern for obtaining the desired pattern. However, variations of the guide pattern affect the pattern to thereby make the process difficult.

SUMMARY

The present disclosure provides a pattern forming method in which pattern collapse may not occur, the roughness of a pattern may be decreased, mask selectivity may be increased, and a fine pattern may be obtained without using a guide pattern.

According to an aspect of the present disclosure, a pattern forming method is disclosed. The method includes forming a pattern forming material film on a substrate as an etching target film, the pattern forming material film having an exposing section that has porosity upon exposure and a non-exposing section, patterning and exposing the pattern forming material film for the exposing section to have the porosity, selectively infiltrating a filling material into voids of the exposing section to reinforce the exposing section, and removing the non-exposing section of the pattern forming material film by dry etching to form a predetermined pattern.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
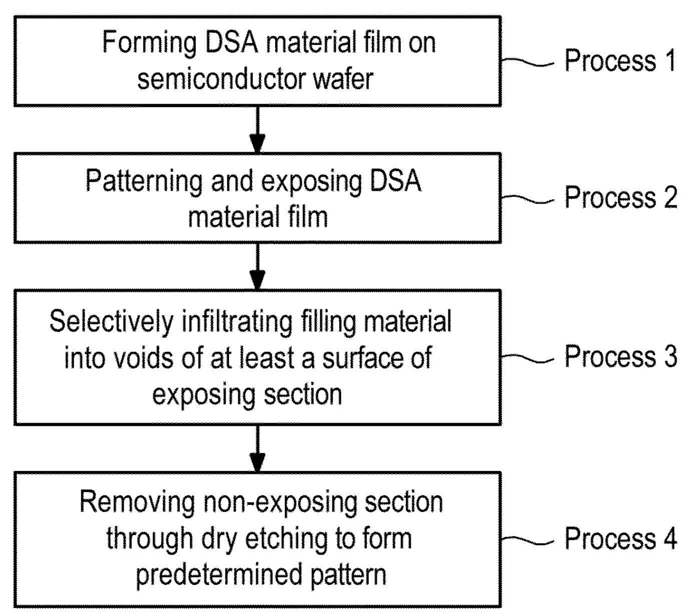
FIG. 1 is a flowchart illustrating a pattern forming method in accordance with an embodiment of the present disclosure.

FIG. 1 is a flowchart illustrating a pattern forming method according to an embodiment of the present disclosure, and FIGS. 2A to 2D are sectional views of processes thereof.

Figure 2A:
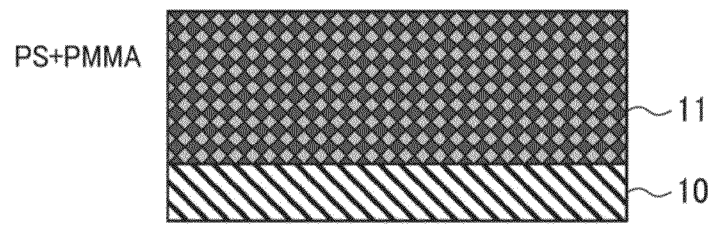
FIGS. 2A to 2D are sectional views of processes illustrating the pattern forming method in accordance with the embodiment of the present disclosure.

First, a DSA material film 11 is formed on a surface of a semiconductor wafer 10 as a target film to be etched (Process 1; FIG. 2A).

As the DSA material film 11, for example, a block copolymer in which a first polymer chain and a second polymer chain are bonded to each other at their ends may be used. An example of the block copolymer may include a copolymer in which polystyrene (PS) and polymethyl methacrylate (PMMA) are bonded. The DSA material film 11 is formed on the semiconductor wafer 10 by a coating method. The coating method may include a spin coating or slit coating.

Figure 2B:
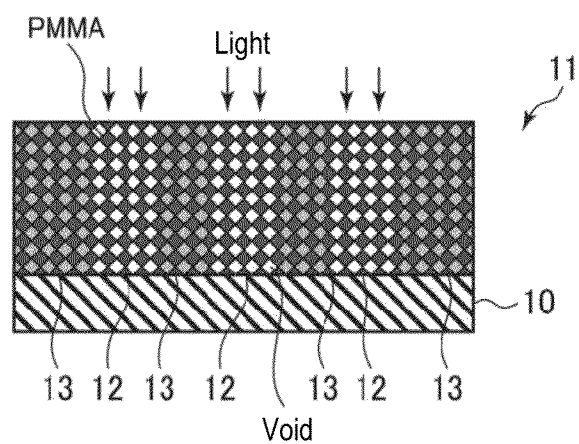

Next, a pattern exposure is performed on the DSA material film 11 (Process 2; FIG. 2B).

As a result of the pattern exposure, an exposing section 12 becomes a porous section made of a second polymer, e.g., PMMA, while the DSA material remains on a non-exposing section 13. DUV light with a wavelength of 193 nm using ArF gas, which is predominantly used in the recent photolithography technology, can be used as exposure light. With this manner, a pattern with a half pitch of 40 nm can be formed. In addition, finer patterns may also be formed using extreme ultraviolet (EUV) light (wavelength of 13.5 nm) with a shorter wavelength or an electron beam (EB).

Figure 2C:
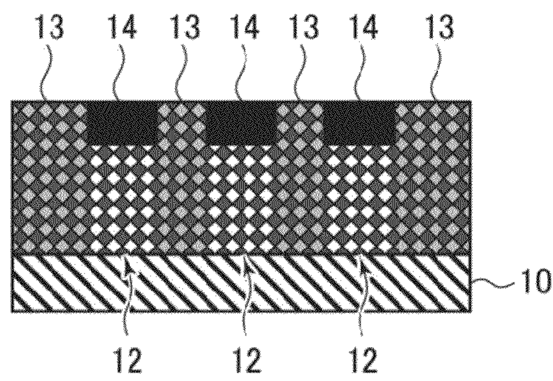

Next, a filling material such as particles is selectively infiltrated into voids of at least a surface of the exposing section 12 (Process 3; FIG. 2C).

This process is for reinforcing the porous exposing section 12, and as a result, a filled portion 14 is formed on the at least surface of the exposing section 12.

For the filling material, it is possible to employ reactant materials which become predetermined materials by reactions, nano particles, organic metal compounds (complexes, alkoxides, and the like), and solutions of derivatives of carbon nano tubes or nano fullerenes. The reactant materials may include cyclopentasilane in which the voids are filled with aSi or SiN by reactions. The nano particles may include colloidal silica ($SiO_2$), Si nano particles, TiO sol, SnO sol, CeO, HfO, ZrO, Ag, Cu and Au. The organic metal compounds may include those that are decomposed to form any one of Al, AlO, ZrO, TiO, W and Si. Further, in case of using the solutions of derivatives of carbon nano tubes or nano fullerenes as the filling material, the carbon nano tubes or nano fullerenes are filled into the voids.

As for the infiltration method, a thermal diffusion method may be used. In addition, if organic metal compounds are used as the filling material, hydrolysis may be utilized. Moreover, a method using supercritical fluids may also be employed. When the thermal diffusion method is used, the filling material is diffused into the voids by heating the semiconductor wafer, for example, to about room temperature (23 degrees C.) to 150 degrees C. On the other hand, when the hydrolysis of the organic metal compounds is used, the voids are first filled with the organic metal compounds and then hydrolyzed. As a result, the voids are filled with any one of Al, AlO, ZrO, TiO, W and Si. In the method using supercritical fluids, the filling material is infiltrated into the voids by using the nano permeability of the supercritical fluids (e.g., supercritical $CO_2$).

Figure 3:
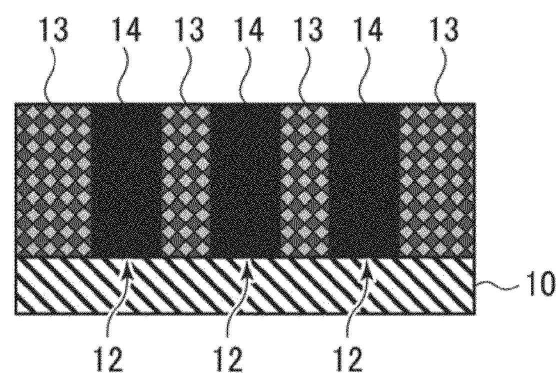
FIG. 3 is a sectional view illustrating a state of a case where a filled portion is formed in an entirety of an exposing section in forming the filled portion by infiltrating a filling material thereto.

As such, the filled portion 14 is formed by infiltrating the filling material into the voids on the at least surface of the porous exposing section 12, so that the exposing section is reinforced. As shown in FIG. 3, it is possible to form the entire exposing section 12 with the filled portion 14, thereby obtaining superior effects.

Figure 2D:
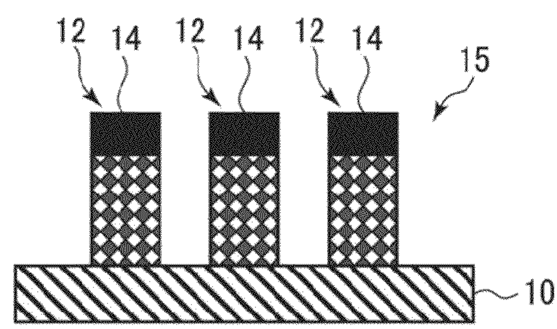

Next, a predetermined pattern is formed by removing the non-exposing section 13 via dry etching (Process 4; FIG. 2D).

For example, anisotropic etching by using a reactive ion etching (RIE) method may be used in the removal of the non-exposing section 13. Since the filled portion 14 formed on at least the surface of the exposing section 12 has been reinforced by the filling material, most part of the filled portion are not removed by RIE, while only the non-exposing section 13 is substantially removed. In this manner, a predetermined pattern 15 can be formed.

As shown in FIG. 3, when the filled portions 14 are formed over the entire exposing section 12, anisotropy is not required and a pattern can be formed at a higher rate by using ashing through oxygen plasma as the dry etching method.

In accordance with the above-described pattern forming method, since at least the surface of the remaining exposing section 12 is reinforced by the filled portion 14, the mask selectivity can be increased in a subsequent etching process. Further, since the pattern is formed by the dry etching method, it is possible to increase the height of the pattern.

Moreover, since the pattern is formed without using the wet development, the pattern is not likely to collapse. In addition, since the image blur is not caused by the wet development, the roughness of the pattern can be lowered.

Further, it is not necessary to use an anti-reflection film or a guide pattern. Thus, it is possible to avoid complexity of the processes while the pattern is not affected by the variation of the guide pattern.

Further, since the DUV light is used as the exposure light, a fine pattern with a half pitch of about 40 nm, which is a size obtainable in a current pattern forming technology by photolithography, can be formed. Moreover, when a SADP technology is combined, it is possible to obtain a fine pattern with a half pitch of down to about 20 nm. Further, upon application of the SADP technology, it is possible to widen the selectivity of the kinds of core materials.

Furthermore, as described above, using the EUV having a shorter wavelength, e.g., a wavelength of 13.5 nm, or an electron beam (EB) enables the formation of a finer pattern.

Various modifications can be made without being limited to the embodiment of the present disclosure. For example, although it has been described in the embodiment that the block copolymer consisting of PS and PMMA is used as the material for forming a pattern, other DSA material films consisting of a block copolymer in which ends of chains of first and second polymers are bonded to each other may be used. Moreover, the material for forming a pattern is not limited to such DSA material films. The pattern forming material may be any inorganic or organic materials, as long as a porous body can be formed therefrom by exposure.

Although it has been described in the embodiment that the DSA material film for forming a pattern is formed by a coating method, the present disclosure is not limited to this but a thin film forming technology such as CVD or the like may be used.

According to the present disclosure, the exposing section is formed to have porosity by patterning and exposing the material film for forming a pattern and is reinforced by selectively infiltrating filling material into voids of the exposing section; and a non-exposing section is then removed via dry etching to form a pattern. Thus, it is possible to prevent collapsing of the pattern and/or to reduce the roughness (LER) of the pattern. Accordingly, it is possible to increase mask selectivity and to form a fine pattern without using an anti-reflection film or guide pattern.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pattern forming method in manufacturing a semiconductor device, comprising:

forming a pattern forming material film on a substrate as an etching target film, the pattern forming material film having an exposing section that has porosity upon exposure and a non-exposing section;

exposing only the exposing section of the pattern forming material film, whereby the exposing section becomes a porous section and the non-exposing section remains unchanged;

selectively infiltrating a filling material into voids of the porous exposing section to reinforce the exposing section; and removing the non-exposing section of the pattern forming material film by dry etching to form a predetermined pattern.

2. The method of claim 1, wherein the pattern forming material film is a directed self-assembly material film made of a block copolymer in which a first polymer chain and a second polymer chain are bonded to each other at their ends, and the exposing section comprises the second polymer.

3. The method of claim 2, wherein the first polymer is polystyrene, and the second polymer is polymethyl methacrylate.

4. The method of claim 1, wherein the pattern forming material film is formed by a coating method.

5. The method of claim 1, wherein the filling material is any one of reactant materials that become predetermined materials by reactions, nano particles, organic metal compounds, and solutions of derivatives of carbon nano tubes or nano fullerenes.

6. The method of claim 1, wherein the infiltrating is performed by a thermal diffusion method.

7. The method of claim 1, wherein the infiltrating is performed by hydrolysis, if organic metal compounds are used as the filling material.

8. The method of claim 1, wherein the infiltrating is performed by using supercritical fluids.

9. The method of claim 1, wherein the dry etching for the non-exposing section is reactive ion etching or ashing.

10. The method of claim 1, wherein the exposing is performed by using a deep ultraviolet light.

11. The method of claim 1, wherein the exposing is performed by using an extreme ultraviolet light or an electron beam.

* * * * *